May 11, 1965 C. STROTHER, JR., ETAL 3,183,448

DELAY LINE PULSE POSITION MODULATION DEMODULATOR

Filed April 20, 1962 2 Sheets-Sheet 1

CLAUDE STROTHER JR.
BENNIE D. MACOMBER
*INVENTORS*

BY J. M. St. Amand
ATTORNEY

DELAY LINE PULSE POSITION MODULATION DEMODULATOR

Filed April 20, 1962

2 Sheets-Sheet 2

CLAUDE STROTHER JR.
BENNIE D. MACOMBER
*INVENTORS*

*BY* J. M. St. Amand
*ATTORNEY*

United States Patent Office 3,183,448

Patented May 11, 1965

3,183,448

DELAY LINE PULSE POSITION MODULATION DEMODULATOR

Claude Strother, Jr., Corona, and Bennie D. Macomber, Norco, Calif., assignors to the United States of America as represented by the Secretary of the Navy Filed Apr. 20, 1962, Ser. No. 189,218
9 Claims. (Cl. 329—107)
(Granted under Title 35, U.S. Code (1952), sec. 266)

Figure 1:
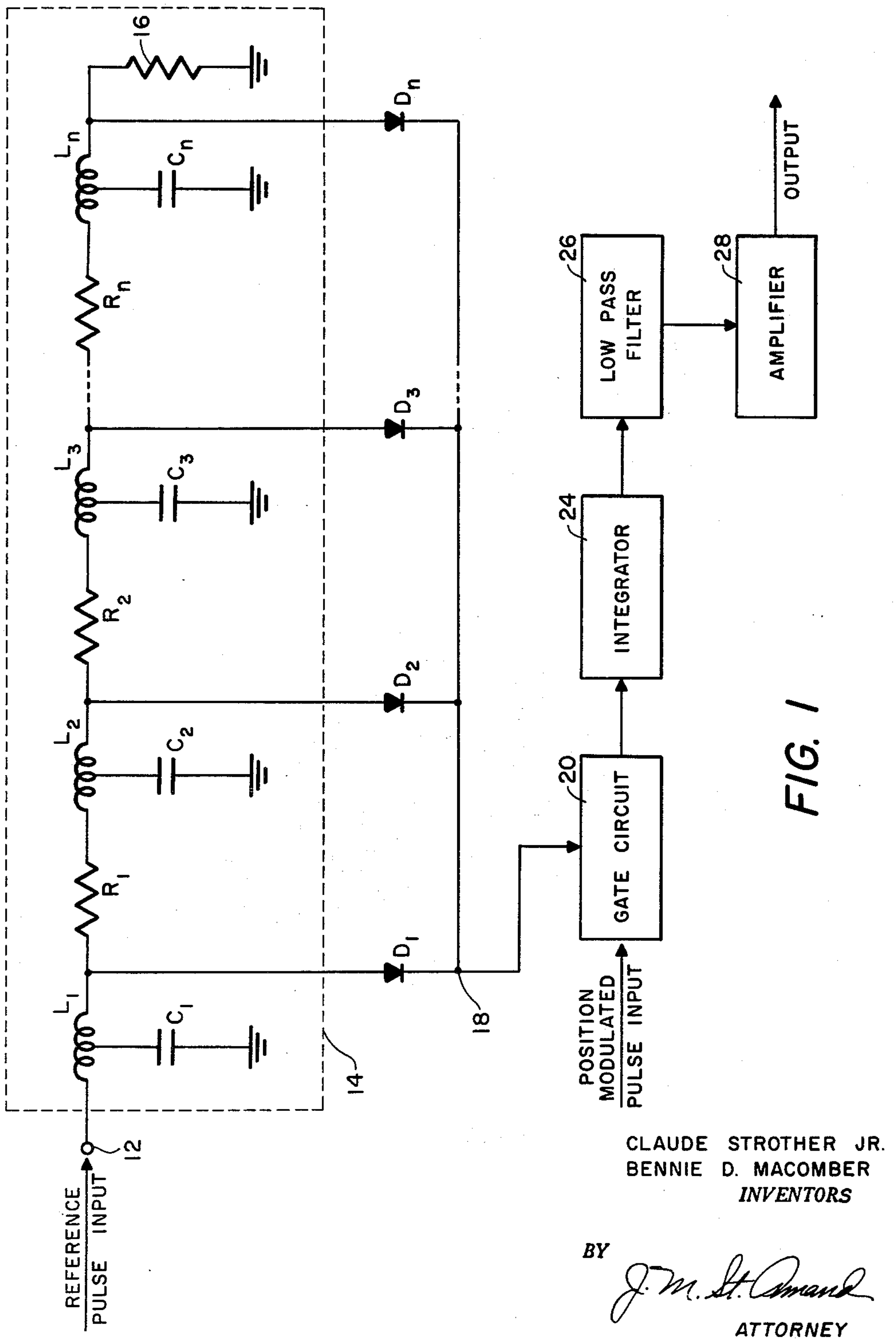

The invention herein described may be manufactured and used by or for the Government of the United States of America for governmental purposes without the payment of any royalties thereon or therefor.

The present invention releates to pulse decoding means and more particularly to detection of pulse position modulation signals.

The purpose of this invention is to provide an improved way of detecting pulse position modulation signals, where detection is made possible of pulses of shorter duration and closer pulse to pulse spacing with resulting reduced pulse deviation, and as a result thereof, a greater number of channels may be achieved in a time multiplex communication system; also, more stable operation of the demodulation circuits result from the high relative stability of the passive delay lines, thus minimizing the servicing and adjustments associated with other established systems.

There are two basic established methods for detection of pulse position modulation and a number of special techniques employing specially constructed cathode ray tubes and vacuum tubes. One of these two basic established methods is based on the conversion of pulse position modulation to pulse width modulation. This is accomplished by using the reference pulse to turn on a multivibrator and using the position modulated pulse to turn off the multivibrator, or vice versa. The resulting pulse width modulation signal is then passed through a low pass filter to obtain the modulation signal. The second of these two basic established methods depends on conversion of the pulse position modulation to pulse amplitude modulation. This is accomplished by adding the position modulated pulse to a sawtooth, or trapezoidal, signal and then slicing out the base of this signal to obtain an amplitude modulated pulse. This pulse is then passed through a low pass filter to recover the original modulation.

The disadvantage of the two basic established methods described above are that the multivbrator sawtooth and trapezoidal generators employed have a minimum pulse width for reliable operation. This factor limits the minimum spacing between the respective channel pulses which in turn limits the maximum number of channels that can be obtained. Another disadvantage is that the long term, month to month, variability in the pulse width of the multivibrators sawtooth and trapezoidal generators is large enough to require frequent readjustment of the width controls to prevent crosstalk, providing channel capacity has been optimized.

The present invention for demodulation of pulse position modulation signals uses a lumped constant delay line and germanium diodes with gate circuit. The primary advantage of the delay line demodulator of the present invention lies in the fact that the minimum time constants and variation in time constants associated with multivibrators and various waveform generators do not restrict its operation.

It is an object of the present invention, therefore, to provide an improved pulse position demodulator using passive elements.

It is another object of the invention to provide an improved pulse position demodulator that uses the attenuation that a pulse incurs in being transmitted down a delay line to supply a slope for detection purposes.

Still another object of the invention is to provide an improved pulse position demodulator which uses a delay line attenuation slope to provide conversion of pulse position modulation to pulse amplitude modulation.

A further object of the invention is to provide a pulse position demodulator circuit which uses a gate circuit in conversion of a pulse position modulation signal to a pulse amplitude modulated signal.

Other objects and many of the attendant advantages of this invention will become readily appreciated as the same becomes better understood by reference to the following detailed description when considered in connection with the accompanying drawings wherein:

FIG. 1 is a preferred embodiment of a pulse position modulator demodulator circuit of the present invention.

FIG. 2*a* illustrates the reference signal input to the delay line.

FIG. 2*b* illustrates the position modulated pulse input to the gate circuit.

FIG. 2*c* shows the waveform from the delay line at a common junction.

FIG. 2*d* shows the amplitude modulated pulse at the output of the gate circuit.

The method of demodulation described herein increases maximum channel capacity and at the same time simplifies the circuit design by the utilization of passive elements in a circuit which is capable of faster response than heretofore available from established methods. A linear attenuating delay line is used in combination with a gate circuit to convert pulse position modulation (PPM) to pulse amplitude modulation (PAM). The modulation signal is then conventionally obtained by passing the amplitude modulated pulse through an integrator, a low pass filter and an amplifier. Such a circuit is shown in FIG. 1.

A reference pulse which is derived from a synchronizing or marker signal, is applied at input terminal 12 and transmitted along the special lumped constant transmission line 14. Normally a delay line will have logarithmic attenuation characteristics, however, in the present invention transmission line 14 is padded with series resistors $R_1$, $R_2$ . . . $R_n$, to obtain a linear pulse attenuation verses pulley delay time of the incident pulse as it is transmitted along the line. Load resistor 16 terminates the delay line 14. Special delay line 14 is tapped at a plurality of points, corresponding approximately to the duration of pulse widths of the reference pulse or the modulated pulse which must be of the same time duration, through diodes $D_1$, $D_2$, $D_3$ . . . $d_n$ to allow transmission of the reference pulse from the special delay line 14 to a gate circuit 20 at the time of occurrence of a position modulated pulse. When the position modulated pulse is applied to gate 20, one of the diodes $D_1$ . . . $D_n$ (corresponding to the position of the reference pulse on the delay line) will conduct and the reference pulse will be passed to integrator 24 via gate circuit 20. Since the time of occurrence of the position modulated pulse is proportional to its modulation, and since the attenuation of the reference pulse is proportional to its point of transmission from the delay line through a diode, the position modulation of the position modulated pulse has now been converted to the amplitude modulation of the reference pulse. This amplitude modulated pulse is then demodulated by conventional circuitry, integrator 24, filter 26 and amplifier 28, to provide the desired output signal.

Figure 2:
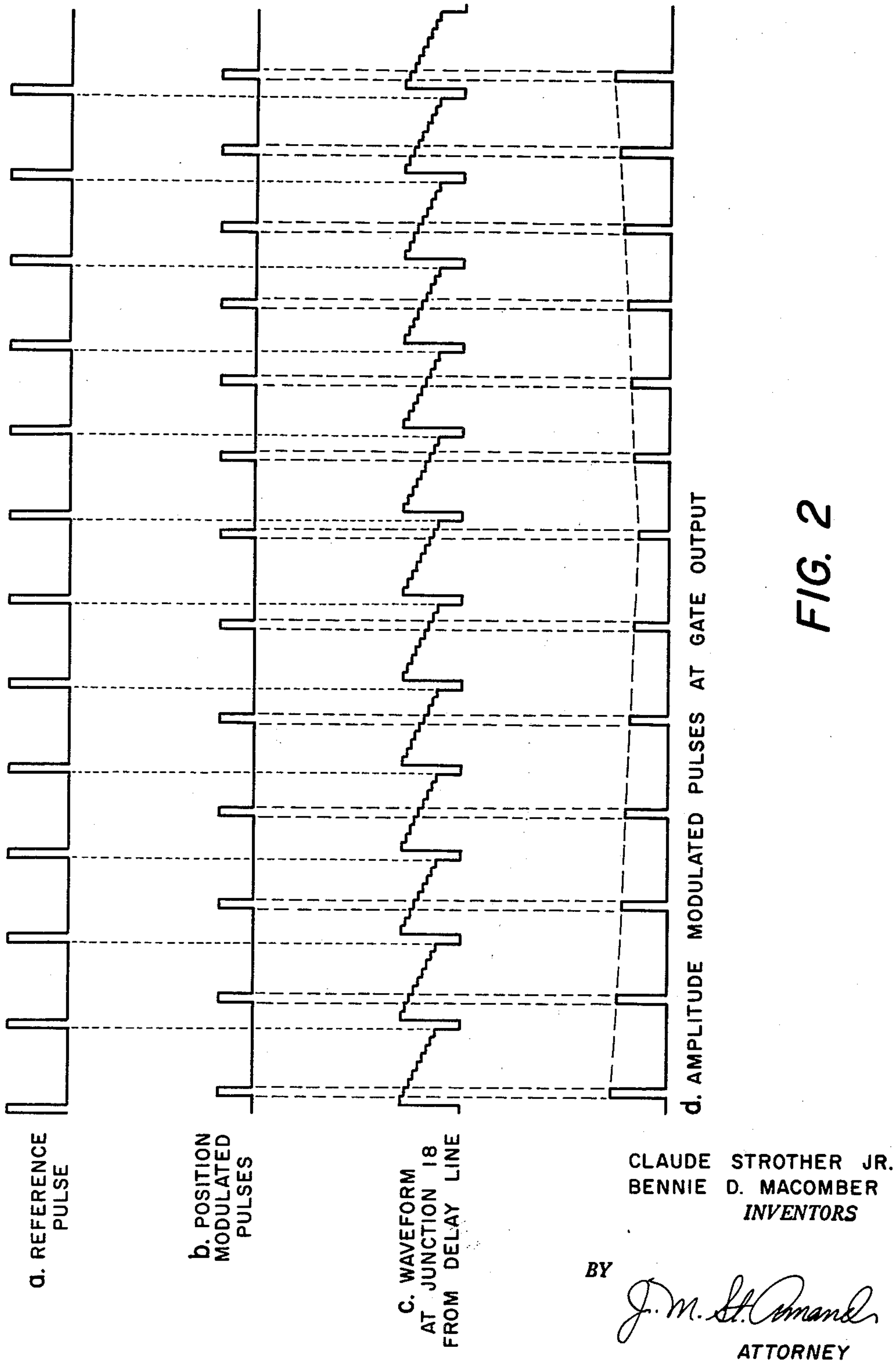

The waveforms at various points in the circuit are shown in FIG. 2 for one complete cycle. The reference pulse applied at terminal 12 to the delay line is shown in FIG. 2*a* and the position modulated pulse applied to gate 20 is shown in FIG. 2*b*. FIG. 2*c* shows the waveform at junction 18; the amplitude of the waveform shown in FIG. 2*c*, transmitted through the gate at the time of the corresponding respective position modulated pulses of FIG. 2*b*, is shown in FIG. 2*d*.

Obviously many modifications and variations of the present invention are possible in the light of the above teachings. It is therefore to be understood that within the scope of the appended claims the invention may be practiced otherwise than as specifically described.

What is claimed is:

1. A pulse position demodulator circuit comprising:
(*a*) a source of reference pulse and a position modulated pulse source, and a delay line composed of a plurality of series inductances and shunt capacitances connected in tandem and being padded with a plurality of series resistors to obtain linear attenuation of a reference pulse applied thereto as it is transmitted along the delay line,
(*b*) said delay line being tapped at a plurality of points along the length thereof through respective diodes connected to a gate circuit at a common junction,
(*c*) said gate circuit allowing transmission of said reference pulse from said delay line through one of said diodes when a position modulated pulse is applied to the gate circuit,
(*d*) the diode conducting when said position modulated pulse is applied to said gate circuit corresponding to the position of said reference pulse on said delay line,
(*e*) the time of occurrence of said position modulated pulse being proportional to its modulation and the attenuation of said reference pulse being proportional to its point of transmission from said delay line through one of said diodes thus converting the position modulation of the position modulated pulse to the amplitude modulation of the reference pulse when passed through said gate circuit.

2. A pulse position demodulator circuit comprising:
(*a*) a source of reference pulse and a position modulated pulse source, and a delay line composed of a plurality of series inductances and shunt capacitances connected in tandem and being padded with a plurality of series resistor to obtain linear attenuation of a reference pulse applied thereto as it is transmitted along the delay line,
(*b*) said delay line being tapped at a plurality of points along the length thereof through respective diodes connected to a gate circuit,
(*c*) said gate circuit allowing transmission of said reference pulse from said delay line through one of said diodes when a position modulated pulse is applied to the circuit,
(*d*) the time of occurrence of said position modulated pulse being proportional to its modulation and the attenuation of said reference pulse being proportional to its point of transmission from said delay line through one of said diodes thus converting the position modulation of the position modulated pulse to the amplitude modulation of the reference pulse when passed through said gate circuit.

3. A pulse position demodulator circuit comprising:
(*a*) a source of reference pulse and a position modulated pulse source, and a delay line composed of a plurality of series inductances and shunt capacitances connected in tandem and being padded with a plurality of series resistor to obtain linear attenuation of a reference pulse applied thereto as it is transmitted along the delay line,
(*b*) said delay line being tapped at a plurality of points along the length thereof through respective diodes connected to a gate circuit at a common junction,
(*c*) said gate circuit allowing transmission of said reference pulse from said delay line through one of said diodes when a position modulated pulse is applied to the gate circuit,
(*d*) the diode conducting when said position modulated pulse is applied to said gate circuit corresponding to the position of said reference pulse on said delay line thus converting the position modulation of the position modulated pulse to the amplitude modulation of the reference pulse when passed through said gate circuit.

4. A pulse position demodulator circuit comprising:
(*a*) a source of reference pulse and a position modulated pulse source, and a delay line composed of a plurality of series inductances and shunt capacitances connected in tandem and being padded with a plurality of series resistors to obtain linear attenuation of a reference pulse applied thereto as it is transmitted along the delay line,
(*b*) said delay line being tapped at a plurality of points along the length thereof through respective diodes connected to a gate means,
(*c*) said gate means allowing transmission of said reference pulse from said delay line through one of said diodes when a position modulated pulse is applied to the gate means,
(*d*) the diode conducting when said position modulated pulse is applied to said gate means corresponding to the position of said reference pulse on said delay line,
(*e*) the time of occurrence of said position modulated pulse being proportional to its modulation and the attenuation of said reference pulse being proportional to its point of transmission from said delay line through one of said diodes thus converting the position modulation of the position modulated pulse to the amplitude modulation of the reference pulse when passed through said gate means, and means for demodulating this resultant amplitude modulated pulse to provide the desired output signal.

5. A pulse position demodulator circuit comprising:
(*a*) a source of reference pulse and a position modulated pulse source, and a delay line being padded with a plurality of resistive elements to obtain linear attenuation of a reference pulse applied thereto as it is transmitted along the delay line,
(*b*) said delay line being tapped at a plurality of points along the length thereof through respective diodes connected to a gate circuit at a common junction,
(*c*) said gate circuit allowing transmission of said reference pulse from said delay line through one of said diodes when a position modulated pulse is applied to the gate circuit,
(*d*) the diode conducting when said position modulated pulse is applied to said gate circuit corresponding to the position of said reference pulse on said delay line,
(*e*) the time of occurrence of said position modulated pulse being proportional to its modulation and the attenuation of said reference pulse being proportional to its point of transmission from said delay line through one of said diodes thus converting the position modulation of the position modulated pulse to the ampltiude modulation of the reference pulse when passed through said gate circuit.

6. A pulse position demodulator circuit comprising:
(*a*) a source of reference pulse and a position modulated pulse source, and a delay line being padded with a plurality of resistive elements to obtain linear attenuation of a reference pulse applied thereto as it is transmitted along the delay line,
(*b*) said delay line being tapped at a plurality of points along the length thereof through respective diodes connected to a gate circuit,
(*c*) said gate circuit allowing transmission of said reference pulse from said delay line through one of said diodes when a position modulated pulse is applied to the gate circuit,
(*d*) the time of occurrence of said position modulated pulse being proportional to its modulation and the attenuation of said reference pulse being proportional to its point of transmission from said delay line through one of said diodes thus converting the position modulation of the position modulated pulse to the amplitude modulation of the reference pulse when passed through said gate circuit.

7. A pulse position demodulator circuit comprising:
(*a*) a source of reference pulse and a position modulated pulse source, and a delay line being padded with a plurality of resistive elements to obtain linear attenuation of a reference pulse applied thereto as it is transmitted along the delay line,
(*b*) said delay line being tapped at a plurality of points along the length thereof through respective diodes connected to a gate means,
(*c*) said gate means alolwing transmission of said reference pulse from said delay line through one of said diodes when a position modulated pulse is applied to the gate means,
(*d*) the diode conducting when said position modulated pulse is applied to said gate means corresponding to the position of said reference pulse on said delay line,
(*e*) the time of occurrence of said position modulated pulse being proportional to its modulation and the attenuation of said reference pulse being proportional to its point of transmission from said delay line through one of said diodes thus converting the position modulation of the position modulated pulse to the amplitude modulation of the reference pulse when passed through said gate means, and means for demodulating this resultant amplitude modulated pulse to provide the desired output signal.

8. A pulse position demodulator circuit comprising:
(*a*) a source of reference pulse and a position modulated pulse source, and a distributed constant delay line being padded with a plurality of resistive elements to obtain linear attenuation of a reference pulse applied thereto as it is transmitted along the delay line,
(*b*) said delay being tapped at a plurality of points along the length thereof through respective diodes connected to a gate circuit at a common junction,
(*c*) said gate circuit allowing transmission of said reference pulse from said delay line through one of said diodes when a position modulated pulse is applied to the gate circuit,
(*d*) the diode conducting when said position modulated pulse is applied to said gate circuit corresponding to the position of said reference pulse on said delay line,
(*e*) the time of occurrence of said position modulated pulse being proportional to its modulation and the attenuation of said reference pulse being proportional to its point of transmission from said delay line through one of said diodes thus converting the position modulation of the position modulated pulse to the amplitude modulation of the reference pulse when passed through said gate circuit.

9. A pulse position demodulator circuit comprising:
(*a*) a source of reference pulse and a position modulated pulse source, and a delay line composed of a plurality of series inductances and shunt capacitances connected in tandem and being padded with a plurality of series resistors to obtain linear attenuation of a reference pulse applied thereto as it is transmitted along the delay line,
(*b*) said delay line being tapped at a plurality of points along the length thereof through respective diodes connected to a gate means,
(*c*) said gate means allowing transmission of said reference pulse from said delay line through one of said diodes when a position modulated pulse is applied to the gate means,
(*d*) the time of occurrence of said position modulated pulse being proportional to its modulation and the attenuation of said reference pulse being proportional to its point of transmission from said delay line through one of said diodes thus converting the position modulation of the position modulated pulse to the amplitude modulation of the reference pulse when passed through said gate means, and means for demodulating this resultant amplitude modulated pulse to provide the desired output signal.

References Cited by the Examiner

UNITED STATES PATENTS

| | | | |
|---|---|---|---|
| 2,542,991 | 2/51 | Chatterjea et al. | 329—107 X |
| 2,691,727 | 10/54 | Lair | 333—29 X |
| 2,891,154 | 6/59 | Holmes | 329—107 |

ROY LAKE, *Primary Examiner.*